United States Patent
Stuetzle et al.

(10) Patent No.: US 9,310,692 B2
(45) Date of Patent: Apr. 12, 2016

(54) COMPONENT FOR SETTING A SCAN-INTEGRATED ILLUMINATION ENERGY IN AN OBJECT PLANE OF A MICROLITHOGRAPHY PROJECTION EXPOSURE APPARATUS

(75) Inventors: Ralf Stuetzle, Aalen (DE); Martin Endres, Koenigsbronn (DE); Jens Ossmann, Aalen (DE); Michael Layh, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1141 days.

(21) Appl. No.: 12/916,882

(22) Filed: Nov. 1, 2010

(65) Prior Publication Data

US 2011/0096317 A1    Apr. 28, 2011

Related U.S. Application Data

(63) Continuation of application No. PCT/EP2009/002465, filed on Apr. 3, 2009.

(60) Provisional application No. 61/050,286, filed on May 5, 2008.

(30) Foreign Application Priority Data

May 5, 2008 (DE) .......................... 10 2008 001 553

(51) Int. Cl.
*G03B 27/52* (2006.01)
*G03F 7/20* (2006.01)

(52) U.S. Cl.
CPC ........ *G03F 7/70191* (2013.01); *G03F 7/70066* (2013.01); *G03F 7/70083* (2013.01); *G03F 7/70558* (2013.01)

(58) Field of Classification Search
CPC . G03F 7/70083; G03F 7/70075; G03F 7/701; G03F 7/70558; G03F 7/70066; G03F 7/70141; G03F 7/70133; G03F 7/70091; G03F 7/7025
USPC ....................................... 355/53, 67
See application file for complete search history.

(56) References Cited

U.S. PATENT DOCUMENTS

| 5,966,202 A | 10/1999 | McCullough |
| 6,013,401 A * | 1/2000 | McCullough et al. .......... 430/30 |

(Continued)

FOREIGN PATENT DOCUMENTS

| EP | 0 952 491 | 10/1999 |
| EP | 2 031 640 | 3/2009 |

(Continued)

OTHER PUBLICATIONS

Japanese Office Action, with translation thereof, for corresponding JP Appl No. 2011-507802, dated Jan. 31, 2013.
Office Action for corresponding German Application No. DE 10 2008 001 553.9, dated Jan. 8, 2009.
The International Search Report and Written Opinion for corresponding PCT Appl No. PCT/EP2009/02465, mailed Aug. 11, 2009.

*Primary Examiner* — Mesfin T Asfaw
(74) *Attorney, Agent, or Firm* — Fish & Richardson P.C.

(57) ABSTRACT

A component for setting a scan-integrated illumination energy in an object plane of a microlithography projection exposure apparatus is disclosed. The component includes a plurality of diaphragms which are arranged alongside one another with respect to a direction perpendicular to the scan movement and which differ in their form and the position of which can be altered approximately in the scan direction so that a portion of the illumination energy can be vignetted by at least one diaphragm. The form of the individual diaphragm is specifically adapted to the form of the illumination in a diaphragm plane in which the component is arranged. This has the effect that at least parts of the delimiting edges of two diaphragms always differ in the case of an arbitrary displacement of the diaphragms.

35 Claims, 12 Drawing Sheets

(56) References Cited

U.S. PATENT DOCUMENTS

| | | | |
|---|---|---|---|
| 6,097,474 A | 8/2000 | McCullough | |
| 7,064,805 B2 | 6/2006 | Nemoto | |
| 2003/0002021 A1* | 1/2003 | Sato | 355/67 |
| 2005/0057737 A1* | 3/2005 | Tsuji | 355/67 |
| 2005/0122502 A1 | 6/2005 | Nemoto | |
| 2006/0244941 A1 | 11/2006 | Gruner et al. | |
| 2007/0014112 A1 | 1/2007 | Ohya et al. | |
| 2007/0268473 A1 | 11/2007 | Kawahara | |
| 2009/0053618 A1* | 2/2009 | Goehnermeier | 430/5 |
| 2009/0073404 A1* | 3/2009 | Muramatsu | 355/53 |

FOREIGN PATENT DOCUMENTS

| | | |
|---|---|---|
| JP | H 10-340854 | 12/1998 |
| JP | 2000-082655 | 3/2000 |
| JP | 2005-175040 | 6/2005 |
| JP | 2006-134932 | 5/2006 |
| JP | 2007-207821 | 8/2007 |
| JP | 2007-335849 | 12/2007 |
| WO | WO 2007/145139 | 12/2007 |

* cited by examiner

COMPONENT FOR SETTING A SCAN-INTEGRATED ILLUMINATION ENERGY IN AN OBJECT PLANE OF A MICROLITHOGRAPHY PROJECTION EXPOSURE APPARATUS

CROSS-REFERENCE TO RELATED APPLICATIONS

This application is a continuation of, and claims benefit under 35 USC 120 to, international application PCT/EP2009/02465, filed Apr. 3, 2009, which claims benefit of German Application No. 10 2008 001 553.9, and U.S. Ser. No. 61/050,286, both filed May 5, 2008. International application PCT/EP2009/02465 is hereby incorporated by reference in its entirety.

FIELD

The disclosure relates to a component for setting a scan-integrated illumination energy in an object plane of a microlithography projection exposure apparatus, where the component includes a plurality of diaphragms each having a delimiting edge which can delimit an illumination field in the object plane. Furthermore, the disclosure relates to an illumination system and a projection exposure apparatus which include such a component, and to a method for producing microelectronic components with a projection exposure apparatus of this type.

BACKGROUND

Components for setting a scan-integrated illumination energy in an object plane of a microlithography projection exposure apparatus are known for example from EP0952491A2 and US 2006/0244941.

Microlithography projection exposure apparatuses used for producing microelectronic components include, among other things, a light source, an illumination system for illuminating a structure-bearing mask (the so-called reticle), and a projection optical unit for imaging the mask onto a substrate (wafer). The substrate contains a photosensitive layer, which is chemically altered by the application of a radiation dose. In this case, the reticle is arranged in the object plane and the wafer is arranged in the image plane of the projection optical unit of the microlithography projection exposure apparatus. In this case, the optical components of the illumination system and of the projection optical unit can be either refractive or reflective components. Combinations of refractive and reflective components are also possible. Likewise, the reticle can be embodied in either reflective or transmissive fashion. Such apparatuses generally are formed completely of reflective components particularly when they are operated with a radiation having a wavelength of less than approximately 100 nm.

Microlithography projection exposure apparatuses are often operated as so-called scanners. This means that the reticle is moved through a slotted illumination field along a scan direction, while the wafer is correspondingly moved in the image plane of the projection optical unit. The ratio of the speeds of wafer to reticle corresponds to the magnification of the projection optical unit between reticle and wafer, which is usually less than 1. Since the chemical alteration of the photosensitive layer often takes place to a sufficient extent only after a specific radiation dose has been administered, it is often desirable to ensure that all regions of the wafer which are intended to be exposed receive the same radiation energy.

Non-uniformities in the distribution of the radiation energy in the object plane can lead to variations in the feature size since the position of the edges of structures to be exposed depends on whether or not the desired radiation energy for exposure was attained. Specific components are used in order to compensate for non-uniformities in the distribution of the radiation energy. One such component can include, for example, two mutually opposite arrangements of identical, vignetting, finger-like diaphragms which adjoin one another and are oriented substantially parallel to the scan direction. Each of these diaphragms is moveable for example in the scan direction, such that the distance between ends of a diaphragm pair which lie opposite one another in the scan direction can be set. It is thus possible to provide a slotted illumination field in the object plane, the field having a varying width in the scan direction along the direction perpendicular to the scan direction. Since the radiation energy is integrated along the scan direction on account of the scan process, the scan-integrated radiation energy desired for chemically altering the photosensitive layer can be set in a targeted manner. Those edges of the diaphragms which delimit the illumination field thus function as upper and lower integration limits. Such edges are referred to hereinafter as delimiting diaphragm edges since they delimit the illumination field in the object plane.

SUMMARY

The disclosure is intended to provide an improved component for setting a scan-integrated illumination energy in an object plane of a microlithography projection exposure apparatus.

In some embodiments, the disclosure provides a component for setting a scan-integrated illumination energy in an object plane of a microlithography projection exposure apparatus, where the component is configured so that at least parts of the delimiting edges of two diaphragms always differ in the case of an arbitrary displacement of the diaphragms.

A targeted setting of the diaphragm form of each individual one of the plurality of diaphragms to the specific illumination of the diaphragm plane is possible as a result. A more accurate setting of the scan-integrated illumination energy can thus be realized. This is important particularly when the illumination in the diaphragm plane has great inhomongenaties or non-uniform boundaries. By virtue of the differing configuration according to the disclosure of the delimiting edges of two diaphragms which differ with regard to their form, e.g. in terms of curvature or angle, the component can be adapted for example to the non-uniform boundary of the illumination.

A configuration of the component such that it includes an adjusting device for altering the position of the diaphragms encompasses the advantage that in the case of a change in the illumination in the diaphragm plane, the position of the diaphragms can be adapted in order to perform a correction of the scan-integrated illumination energy. In this case, position changes are conceivable which have a magnitude such that up to 10% or more of the energy can be vignetted in the diaphragm plane. Such a device can include drivable actuators, for example, which can be used to alter in a targeted manner the position of the diaphragms on the basis of a control signal of a control or regulating unit. Such driving or regulating enables the diaphragm position to be set rapidly and flexibly.

The arrangement of the diaphragms such that adjacent diaphragms at least partly overlap has the advantage that no gaps whatsoever can occur between diaphragms lying alongside one another.

A further advantage arises if at least one diaphragm is exchangeable. This is because if the illumination of the diaphragm plane changes, for example as a result of degradation of optical elements, then it can become desirable to adapt the form of the delimiting diaphragm edge to the new changed illumination. For this purpose, individual diaphragms or all diaphragms can then be exchanged for diaphragms which have a different form of the delimiting edge. Alternatively or supplementarily, it is also possible to configure the diaphragms in such a way that at least one diaphragm includes an adapting device for altering the delimiting edges. In such a case, the form of the delimiting diaphragm edge can advantageously be altered even without exchanging diaphragms. It is thus possible for the delimiting edge to be set more rapidly and more flexibly. Such an alteration of the form of the delimiting edges can also become desirable if the position of the diaphragm is altered. In order to ensure a good correction of the scan-integrated illumination energy, the form of the delimiting diaphragm edge is adapted to the energy distribution in the region of the delimiting diaphragm edge. If the diaphragm position and hence the position of the delimiting diaphragm edge is altered, then an adaptation of the edge form can be desirable in order to furthermore ensure the quality of the correction of the scan-integrated illumination energy.

An advantage adaptation to the energy distribution in the region of the delimiting diaphragm edge is possible particularly when the edge has a curvature. In this case, the value of the radius of curvature can lie between zero and infinity. Alternatively, the delimiting edge can also have any other form desired. It is thus possible to adapt the delimiting edge to a multiplicity of possible energy distributions.

An illumination system including such a component described has the advantages that have already been explained above with regard to the component. The arrangement of such a component in or near the object plane or in or near a plane optically conjugate to the object plane has the advantage that each finger-like diaphragm is assigned an influencing region in the object plane substantially one-to-one.

The assigned influencing region of a diaphragm in the object plane should be understood to mean that region of the object plane in which the scan-integrated illumination energy is altered with the aid of the diaphragm. That is to say that the assigned influencing region is that part of the object plane in which the scan-integrated illumination energy changes if the position or form of the assigned diaphragm is altered.

A substantially one-to-one assignment is present if the influencing regions of different diaphragms overlap only little in the object plane. In such a case, it can readily be established which diaphragm has to be altered in terms of form or position in order to influence the scan-integrated illumination energy in a specific region of the object plane. This is owing to the fact that as a result of variation of the diaphragm form or of the position of a diaphragm, a specific region of the illumination in the diaphragm plane can be vignetted or transmitted. This region is referred to hereinafter as the diaphragm region of this diaphragm. If the diaphragm is arranged in or near the object plane or an optically conjugate plane, then a substantially one-to-one assignment of a diaphragm region to an influencing region exists in the form of the imaging. This substantially one-to-one assignment has the effect that after a measurement of the inhomogeneities in the distribution of the radiation energy in the object plane, it is possible to ascertain which of the diaphragms has to be altered in terms of its setting position or, if an adjustment of the setting position of the diaphragm is not sufficient to eliminate the variation, in terms of the form of its delimiting diaphragm edge in order to correct the scan-integrated radiation energy in the object plane.

Such an illumination system can have different illumination fields. An arcuate illumination field is advantageous particularly when the projection optical unit includes reflective components, since, in the case of such a system, vignetting of the radiation as a result of multiple impingement on the same reflective component can be avoided more easily if the illumination field has an arcuate form. In the case of an infinite radius of curvature of the arcuate field, the field undergoes transition to a rectangular form. A rectangular illumination field has the advantage that it can be realized relatively simply with an illumination system.

The arrangement of diaphragms in such a way that it is possible to delimit only one side of the illumination field in the object plane has the advantage that the diaphragms also only have to be arranged on one side of the illumination in the diaphragm plane. A better utilization of the structural space is thereby possible. Particularly if the projection exposure apparatus at least partly includes reflective components, it can be possible that radiation passes through the diaphragm plane repeatedly. In order to avoid an unintentional vignetting of radiation it is advantageous, therefore, if the diaphragms are arranged in a narrowly delimited region, that is to say for example on one side of the beam path.

By contrast, the arrangement of diaphragms in such a way that the illumination field can be delimited on two mutually opposite sides has the advantage that there are a greater number of degrees of freedom in the definition of the position and form of the delimiting diaphragm edges since, in this case, the scan-integrated illumination energy can be altered at a location in the object plane with the aid of two mutually opposite diaphragms.

In this case, it is not absolutely necessary for all the diaphragms to be arranged in the same plane. Thus, it is conceivable, for example, for one portion of the diaphragms to be arranged in a first plane and a second portion of the diaphragms to be arranged in a second plane. An arrangement in more than two planes is also possible. This has the advantage that the structural space can be better utilized.

Furthermore, it is advantageous, in particular, if the form of the delimiting diaphragm edge is adapted to the illumination in the diaphragm plane in such a way that the scan-integrated energy varies in the assigned influencing region by less than 0.5%, such as by less than 0.3%.

This has the effect that all diaphragms can be set in such a way that the scan-integrated illumination energy along the direction perpendicular to the scan direction in the object plane also varies by less than 0.5% and a very uniform feature size thus arises during the imaging of the structure-bearing mask into the image plane. This adaptation can be realized by the form of the delimiting diaphragm edge coming as close as possible to the form of the boundary curve of the illumination in the diaphragm region. The boundary curve can be understood for example as the isointensity line for the illumination power surface density of 1% of the maximum illumination power surface density. Other definitions of a boundary curve are also conceivable. Isointensity lines are lines of constant illumination power surface density in the diaphragm plane. This means that, integrated over a fixed time interval, the same energy surface density is present at all points of the line.

The fact that the form of the delimiting diaphragm edge comes close to the form of the boundary curve means, in particular, that the deviation $\Delta y$ between the delimiting diaphragm edge and the defining line is less than 0.5% of the extent of the illumination in the scan direction. This has the result, inter alia, that the delimiting diaphragm edge has an average angle with respect to the boundary curve of the illumination which is less than 1°, or that the delimiting diaphragm edge has an average curvature whose radius of curvature differs from the average radius of curvature of the boundary curve in the diaphragm region by less than 0.5%.

If the form of the delimiting diaphragm edge substantially corresponds to an isointensity line, than the system has further advantages. If the diaphragm configured in this way is arranged for example in such a way that the delimiting diaphragm edge substantially coincides with the isointensity line, than the profile of the illumination power surface density along the scan direction, the scan profile, has the same edge rise and edge fall at all points of the influencing region.

The fact that the form of the delimiting diaphragm edge substantially corresponds to the form of an isointensity line means, in particular, that the delimiting diaphragm edge has an average angle with respect to an isointensity line of the illumination which is less than 1°, or that the delimiting diaphragm edge has an average curvature whose radius of curvature differs from the average radius of curvature of an isointensity line in the diaphragm region by less than 0.5%.

Alternatively, it is also conceivable to choose the diaphragm form in such a way that it substantially corresponds to the form of an isodose line. In this case, isodose lines are defined as points having the same scan-integrated illumination power surface density. This means that for all points of this line, the value of the integral along the scan direction from minus (or plus) infinity to this point over the illumination power surface density is identical.

The fact that the form of the delimiting diaphragm edge substantially corresponds to the form of an isodose line means, in particular, that the delimiting diaphragm edge has an average angle with respect to an isodose line of the illumination which is less than 1°, or that the delimiting diaphragm edge has an average curvature whose radius of curvature differs from the average radius of curvature of an isodose line in the diaphragm region by less than 0.5%. This has the advantage that the variation of the scan-integrated energy over the influencing region of the diaphragm is automatically minimized if the diaphragm position in the scan direction is chosen such that the delimiting diaphragm edge coincides with the isodose line. Since the delimiting diaphragm edge acts as upper (or lower integral limit in this case, the definition of the isodose line automatically leads to a minimization of the variation of the scan-integrated illumination energy.

An illumination system including a device for measuring the scan-integrated illumination energy in the object plane, which provides a measurement signal, has the advantage that for example the diaphragm position or form of the delimiting edge can be set in a targeted manner with the aid of such a measurement result, in order to ensure a smallest possible variation of the scan-integrated illumination energy over the illumination field. If the illumination system additionally includes a regulating unit for setting the component on the basis of the measurement signal, then a rapid alteration of the component setting can be effected. Such an alteration can consist for example in a position change of at least one diaphragm, the change of the delimiting diaphragm edge or the exchange of diaphragms.

A microlithography projection exposure apparatus including an illumination system of the type mentioned above and a method for producing microstructured components by means of such a projection exposure apparatus have the same advantages that have already been mentioned above with regard to the illumination system.

BRIEF DESCRIPTION OF THE DRAWINGS

Exemplary embodiments of the disclosure are explained below with reference to the drawing, in which.

DETAILED DESCRIPTION

Figure 1:
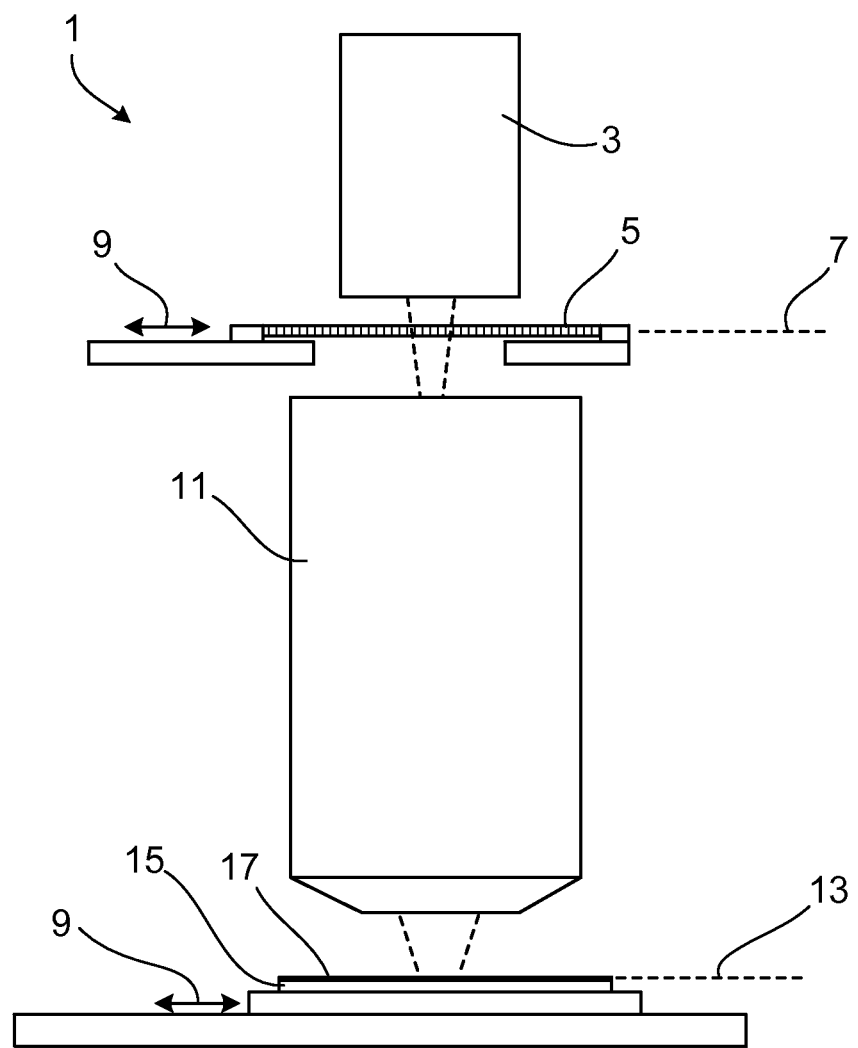
FIG. 1 shows a schematic sectional illustration of a microlithography projection exposure apparatus.

The reference symbols have been chosen such that objects illustrated in FIG. 1 have been provided with single-digit or two-digit numerals. The elements illustrated in the further figures have reference symbols having three and more digits, where the last two digits indicate the element and the digits preceding those indicate the number of the figure in which the object is illustrated. Thus, the reference numerals of identical elements which are illustrated in a number of figures correspond to one another in the last two digits. By way of example, the reference symbols 3, 203 and 503 identify the element 3 in FIGS. 1, 2 and 5.

Therefore the explanation of an element with a reference numeral may be found in the description concerning one of the preceding figures, under the corresponding reference numeral.

FIG. 1 illustrates a simplified illustration of a microlithography projection exposure apparatus 1. In this case, the illumination system 3 illuminates the structure-bearing mask 5, which is arranged in the object plane 7. In this case, the structure-bearing mask can be moved in the scan direction 9. Disposed downstream is the projection optical unit 11, which images the mask into the image plane 13. Situated in the image plane is a substrate 15 containing a photosensitive layer 17, which is chemically altered during the exposure. This is also referred to as a lithographic step. This substrate can likewise be moved along the scan direction 9. The ratio of the scan speeds of substrate to mask corresponds to the magnification of the projection optical unit between mask and substrate, which is usually less than 1, for example 1:4. As a result of the exposure of the photosensitive layer and further processes, which, inter alia, are chemical in nature, a microelectronic component arises.

Figure 2:
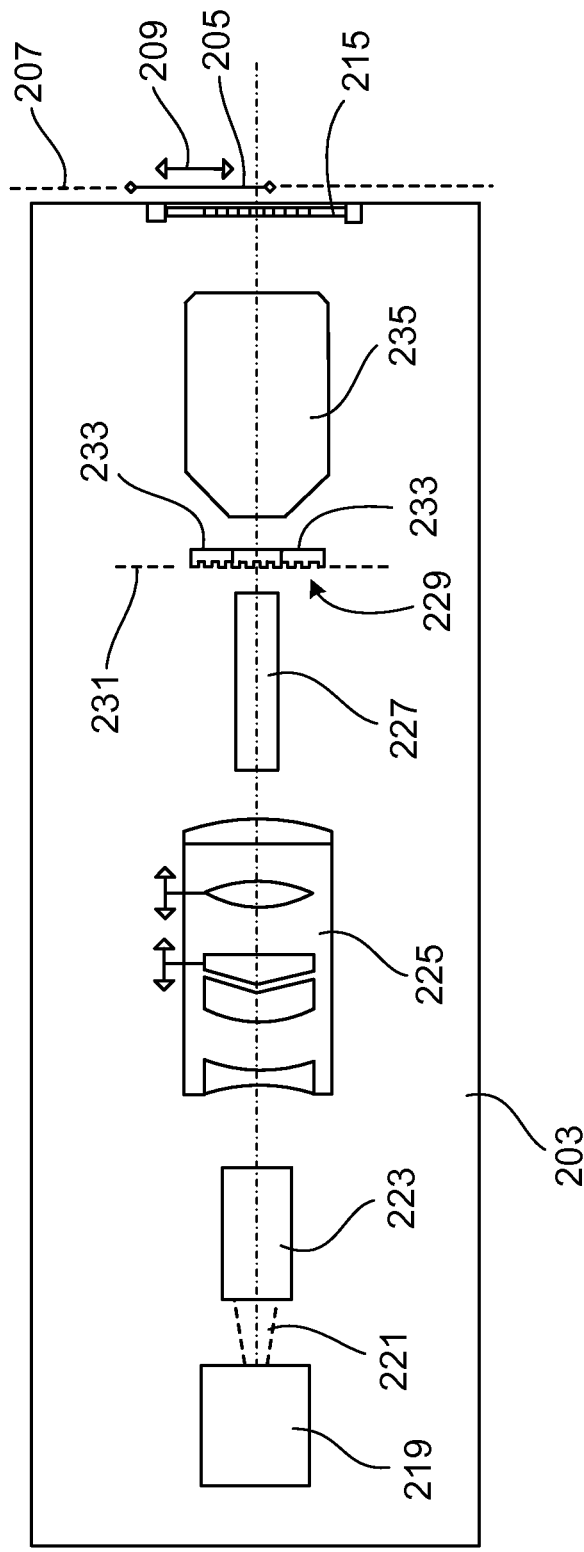
FIG. 2 shows a schematic sectional illustration of an illumination system of a microlithography projection exposure apparatus, which system substantially contains refractive components.

FIG. 2 shows a simplified schematic illustration of an illumination system 203 of a microlithography projection exposure apparatus in a completely or predominantly refractive embodiment. This illumination system contains a light source 219, which generates high-frequency sequences of short light pulses that form the illumination radiation 221. The light source can be, in particular for an illumination system including refractive components, an excimer laser, which generates an illumination radiation having a wavelength of 193 nm, for example. The illumination radiation subsequently passes through a beam shaping unit 223, a zoom-axicon objective 225 for setting different types of illumination, and a rod homogenizer 227, which serves for mixing and homogenizing the illumination radiation. This is followed by the component 229 according to the disclosure for setting the scan-integrated illumination energy in the object plane 207. In the present exemplary embodiment, this component is arranged in a plane 231 optically conjugate to the object plane 207. For illustration reasons, FIG. 2 shows only two finger-like diaphragms 233 lying in the scan direction 209. Disposed downstream, an objective 235 is shown, which images the plane 231 in which the component according to the disclosure is arranged onto the object plane 207. The structure-bearing mask 205 is then arranged in the object plane.

Figure 3:
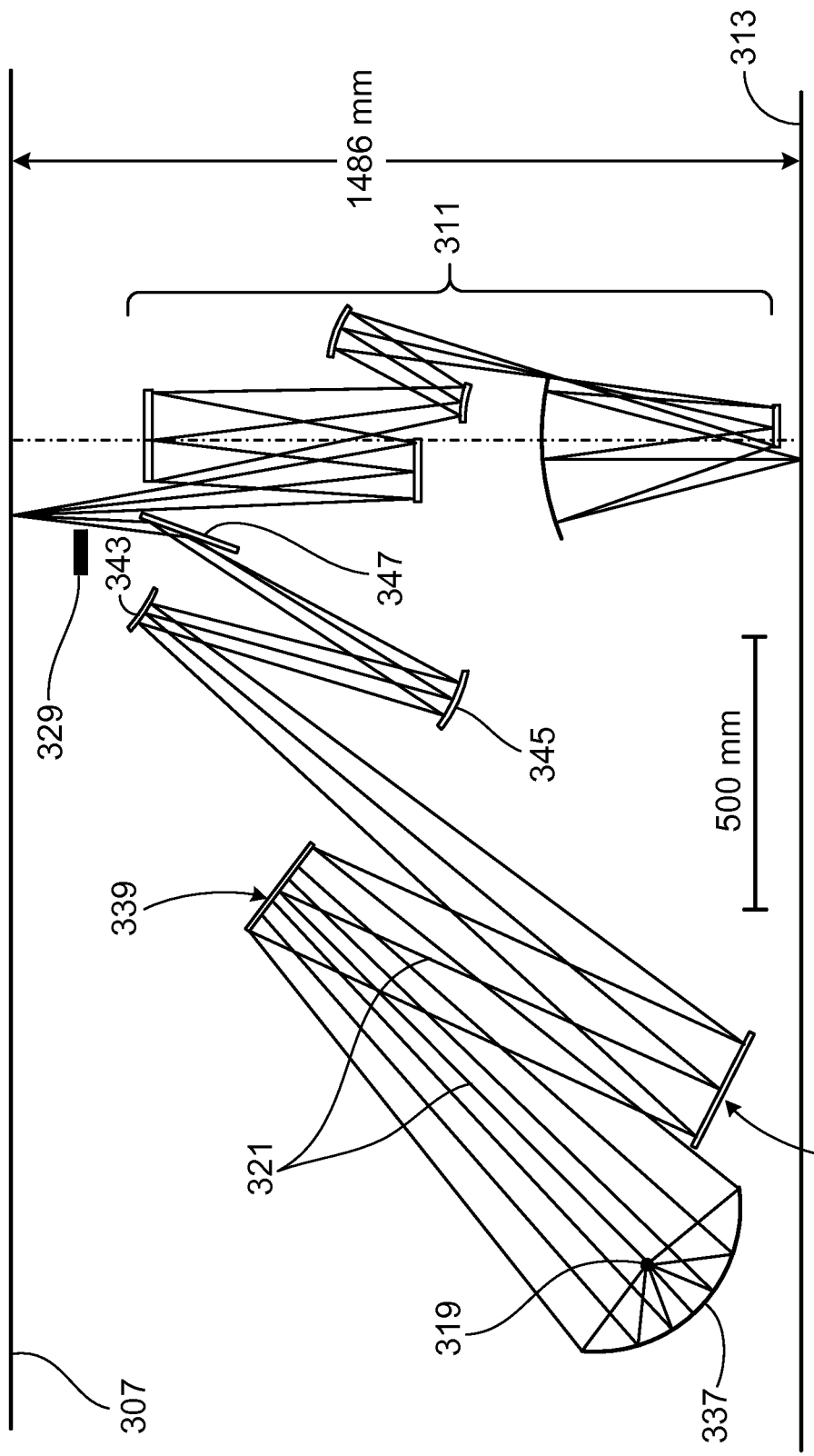
FIG. 3 shows a schematic illustration of an illumination system of a microlithography projection exposure apparatus in an embodiment including reflective components.

FIG. 3 schematically illustrates a microlithography projection exposure apparatus including reflective components. This is advantageous particularly when the wavelength of the illumination radiation used is less than 193 nm, and in particular between 3 nm and 15 nm. The illumination radiation is generated here by a light source 319, which can be a plasma, for example, which is generated by a laser or a discharge. The illumination radiation 321 is then directed by a collector 337 onto the first mirror 339 of a mixing unit 339, 341. Downstream of the second mirror 341 of the mixing unit, the illumination radiation is directed onto an object plane 307 with the aid of the further mirror 343, 345, 347. The structure-bearing mask is once again arranged (not illustrated in the drawing) in the object plane, this mask being configured in reflective fashion in the present exemplary embodiment. The mask is imaged onto the image plane 313 with the aid of a projection optical unit 311. In the present exemplary embodiment, the component 329 according to the disclosure is arranged near to the object plane and optionally, but not necessarily, contains finger-like diaphragms on the opposite side with respect to the projection optical unit, in order not to influence the beam path between object plane and image plane of the projection optical unit in the illustrated embodiment of the projection exposure apparatus. A vignetting of the radiation in this region would impair the imaging of the structure-bearing mask.

Figure 4:
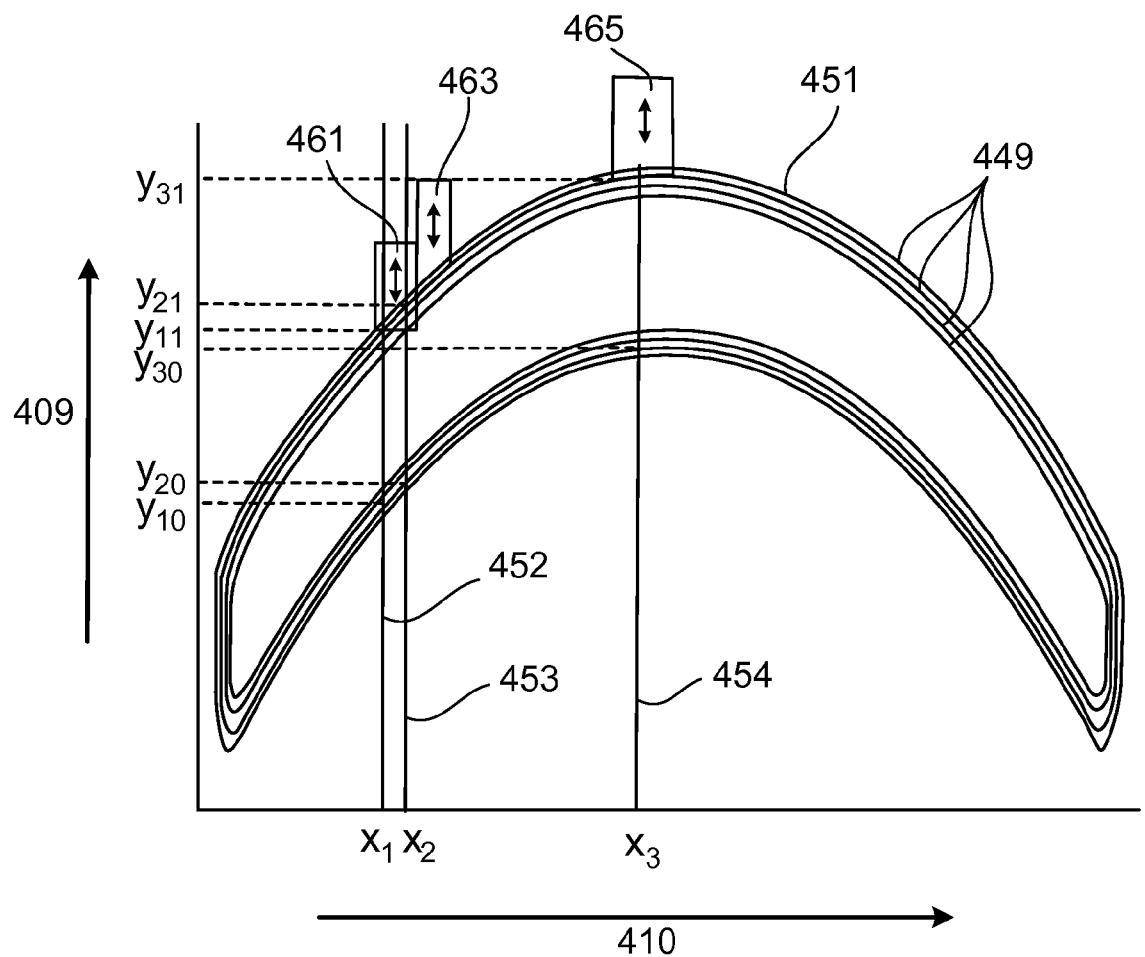
FIG. 4 shows an illumination power surface density in a diaphragm plane with isointensity lines.

FIG. 4 shows by way of example an illumination power surface density $\rho(x, y)$ in the plane of the component according to the disclosure, such as is generated in the case of an illumination system from FIG. 3. The illumination power surface density is illustrated in a system of Cartesian coordinates with the aid of the isointensity lines 449. In this case, the y-axis runs parallel to the scan direction 409 and the x-axis is perpendicular to the scan direction. The direction perpendicular to the scan direction is designated by 410. On the basis of the boundary curve 451 it is evident that an arcuate field is involved in this case. The straight lines 452, 453 and 454 run parallel to the scan direction and intersect the x-axis at the positions $x_1$, $x_2$, and $x_3$. The y coordinates of the points at which, along the straight line 452, the illumination power surface density assumes 20% of its maximum value are designated by $y_{10}$ and $y_{11}$. The same correspondingly applies to the coordinates $y_{20}$, $y_{21}$ and the straight line 453, and to the coordinates $y_{30}$, $y_{31}$ and the straight line 454. The six points $(x_1, y_{10})$, $(x_1, y_{11})$, $(x_2, y_{20})$, $(x_2, y_{21})$, $(x_3, y_{31})$ thus lie on the same isointensity line.

Figure 5:
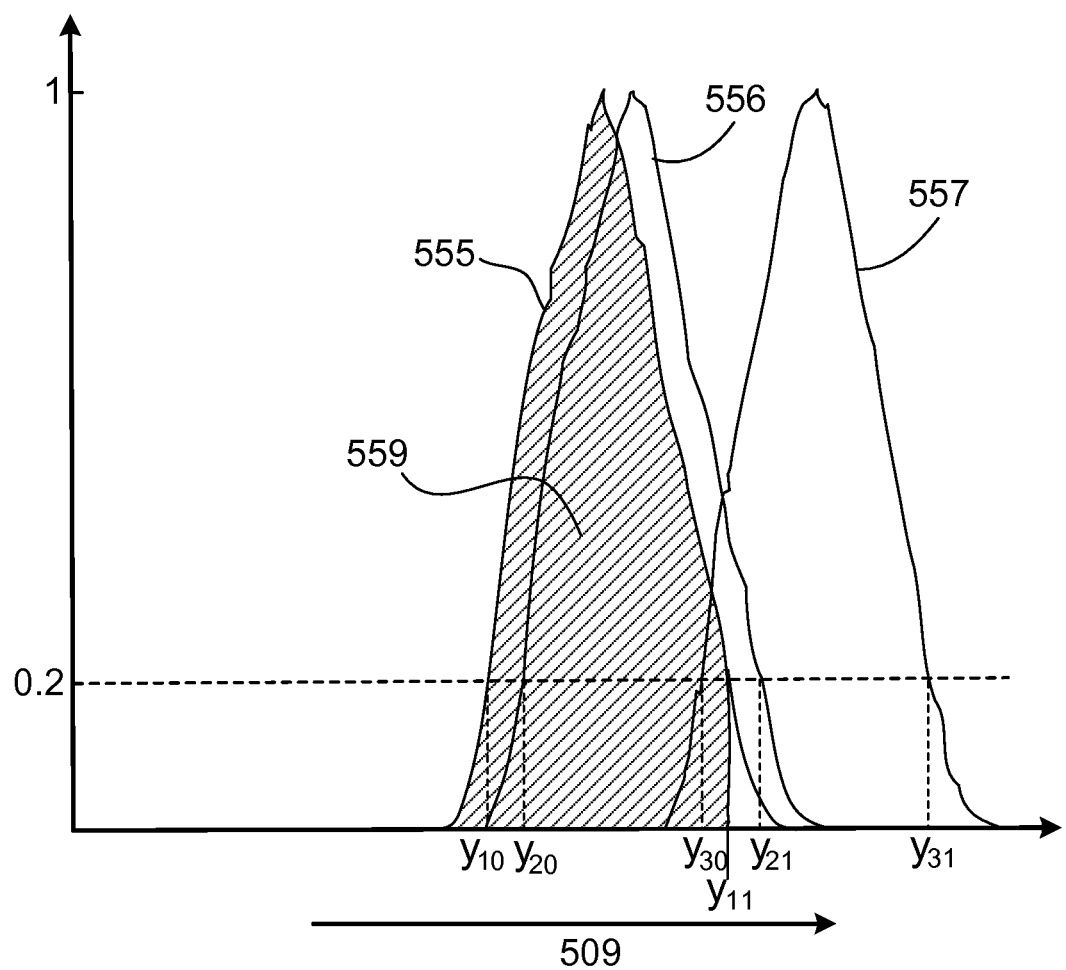
FIG. 5 shows the profile of the illumination power surface density in the diaphragm plane along the lines illustrated in FIG. 4.

FIG. 5 illustrates the profile of the illumination power surface density, the scan profile, along the straight lines from FIG. 4. In this case, 555 designates the scan profile along the straight line 452, 556 designates the scan profile along the straight line 453, and 557 designates the scan profile along the straight line 454. These three scan profiles 555, 556 and 557 are shifted relative to one another substantially in the y direction on account of the arcuate form of the illumination field. In order to ensure a good imaging, however, the scan-integrated illumination power surface density, that is to say the integral $$D(x) = \int_{-\infty}^{\infty} \rho(x,y) dy,$$

should vary as little as possible in the x direction. If the diaphragm planes correspond to the object plane, then this integral is often also referred to as a uniformity curve $U(x)$. This integral can be set by introducing a diaphragm in the plane of the component according to the disclosure. Such a diaphragm ensures that a point in the reticle no longer sees the complete scan-integrated illumination power surface density, but rather only a proportion thereof. This is done by limiting the integral with the aid of the diaphragm. FIG. 5 illustrates the integral 559, for example, which results if the diaphragm 461 in FIG. 4 curtails the integration along the straight line 452. The delimiting diaphragm edge thus intersects the straight line 452 at the coordinates $(x_1, y_{11})$. The position of the delimiting diaphragm edge on the straight line 452 thus acts as an upper integral limit. The scan-integrated illumination power surface density $D(x, y)$ at a position x can therefore be represented as a function of the coordinates of the delimiting diaphragm edges $$D(x,y) = \int_{-\infty}^{y} \rho(x,y') dy'$$

In the present embodiment, the diaphragms are arranged only on one side, such that the integration over the illumination power surface density can be delimited only on one side. This gives rise, therefore, to minus infinity as lower integral limit and y as upper integral limit. Alternatively, however, it is also possible to use diaphragms which delimit the integration on both sides. The scan-integrated illumination power surface density then results as a function of both diaphragm positions $y_0$ for the upper limit and $y_u$ for the lower limit.

$$D(x,y_0,y_u) = \int_{y_u}^{y_0} \rho(x,y') dy'$$

Only the case of a diaphragm on one side is considered further in the text below. However, the disclosure also relates to the case on both sides, and the explanations below can be applied directly to this case.

The diaphragm 461 having the delimiting diaphragm edge which is perpendicular to the scan direction, as is known from the prior art, has the disadvantage, however, that the integrals along the straight lines 452 and 453 both acquire the same upper integral limit. The values of the two integrals thus differ significantly, however, since the scan profiles 555 and 556 are offset relative to one another in the y direction. This can be avoided by the use of a diaphragm 463 according to the disclosure. Here for example the form of the delimiting diaphragm edge can be chosen in such a way that the offset of the scan profiles is taken into account. In this way, it is possible to minimize the variation in the x direction of the values of the integrals.

If the x position of two straight lines parallel to the scan direction are separated from one another to such an extent that they no longer fall within the same diaphragm region, such as the x positions of the straight lines 452 and 454, for example, then a large portion of the offset of the scan profiles 555 and 557 with respect to one another can be accomplished by the setting of the diaphragm position in the y direction. In FIG. 4, the double-headed arrows on the diaphragms 461, 463, 465 indicate that the diaphragms can be altered in their position in the scan direction. However, the setting of the diaphragm position only enables an adaptation with limited accuracy. In order to improve the accuracy, the adaptation according to the disclosure of the delimiting diaphragm edge to the form of the illumination in the diaphragm region is additionally desirable.

Figure 6:
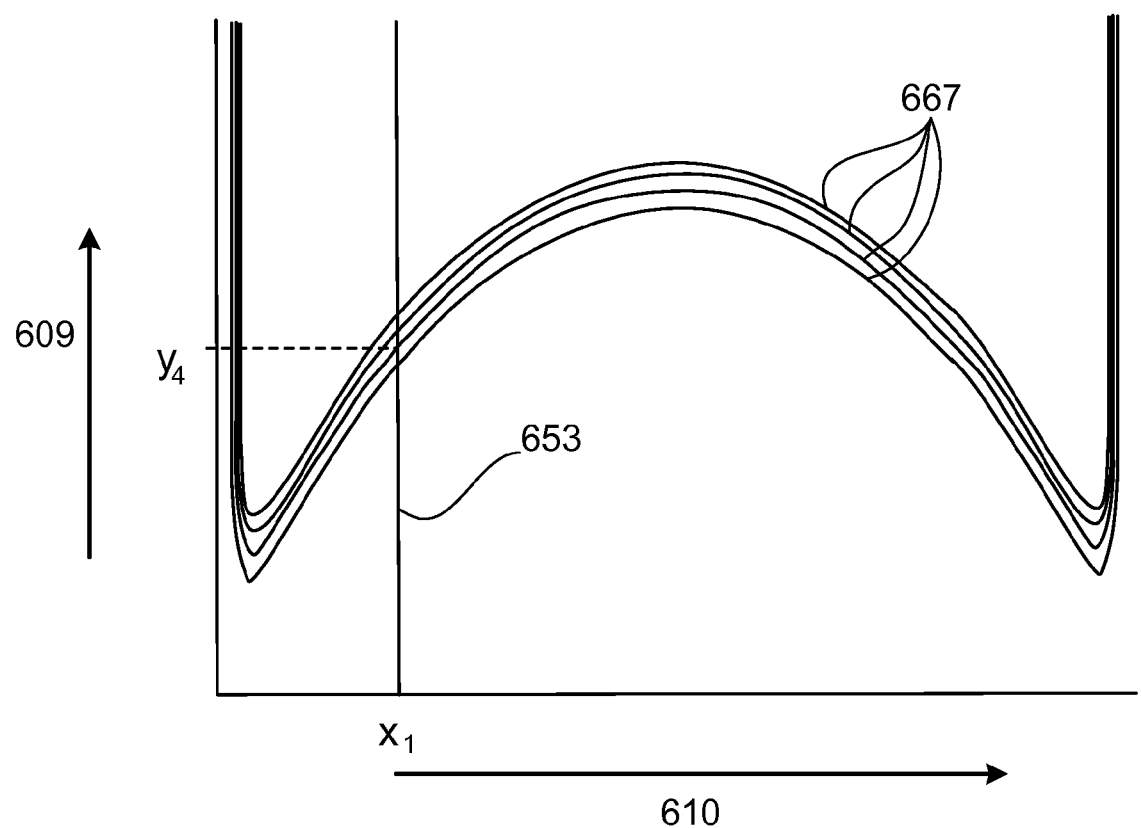
FIG. 6 shows an illumination of the diaphragm plane with isodose lines.

FIG. 6 illustrates the illumination power surface density in the plane of the component according to the disclosure with the aid of the isodose lines 667. Isodose lines are defined as points of identical scan-integrated illumination power surface density, that is to say that at all points of such a line the integral $D(x, y)$ where $$D(x,y) = \int_{-\infty}^{y} \rho(x,y') dy'$$

has the same value. If a diaphragm followed such a line exactly, the value of the integral would be identical everywhere, such that the scan-integrated illumination power surface density would not vary along the x direction. This would have the advantage that a very small variation of the scan-integrated illumination power surface density in the reticle plane can then be ensured.

Figure 7:
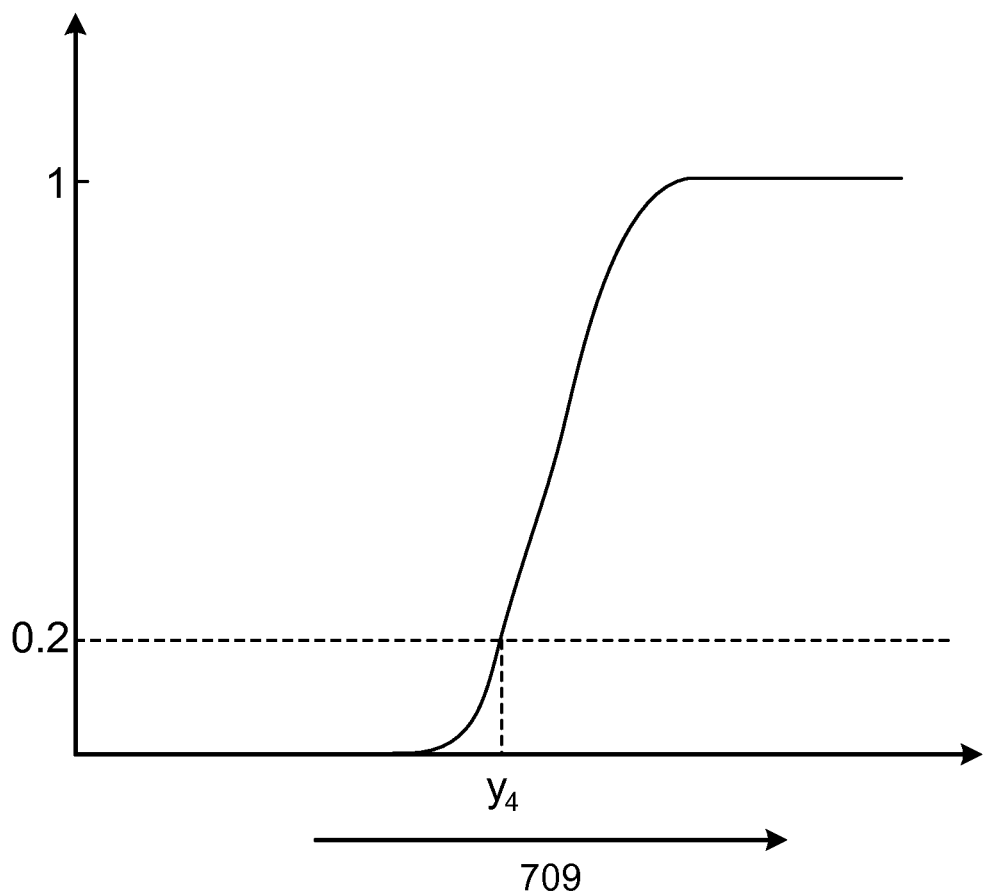
FIG. 7 shows the scan-integrated illumination power surface density in the diaphragm plane as a function of the upper integral limit along the line illustrated in FIG. 6.

FIG. 7 illustrates the scan-integrated illumination power surface density $D(x_1, y)$ along the straight line 653 illustrated in FIG. 6 after normalization to its maximum value.

$$D(x_1,y) = \int_{-\infty}^{y} \rho(x_1,y') dy'$$

In FIG. 5 and FIG. 6, $y_4$ marks the position at which the scan-integrated illumination power surface density assumes 20% of its maximum value. In FIG. 6, therefore, the straight line 653 intersects the 20% isodose line at the position $(x_1, y_4)$.

Figure 8A:
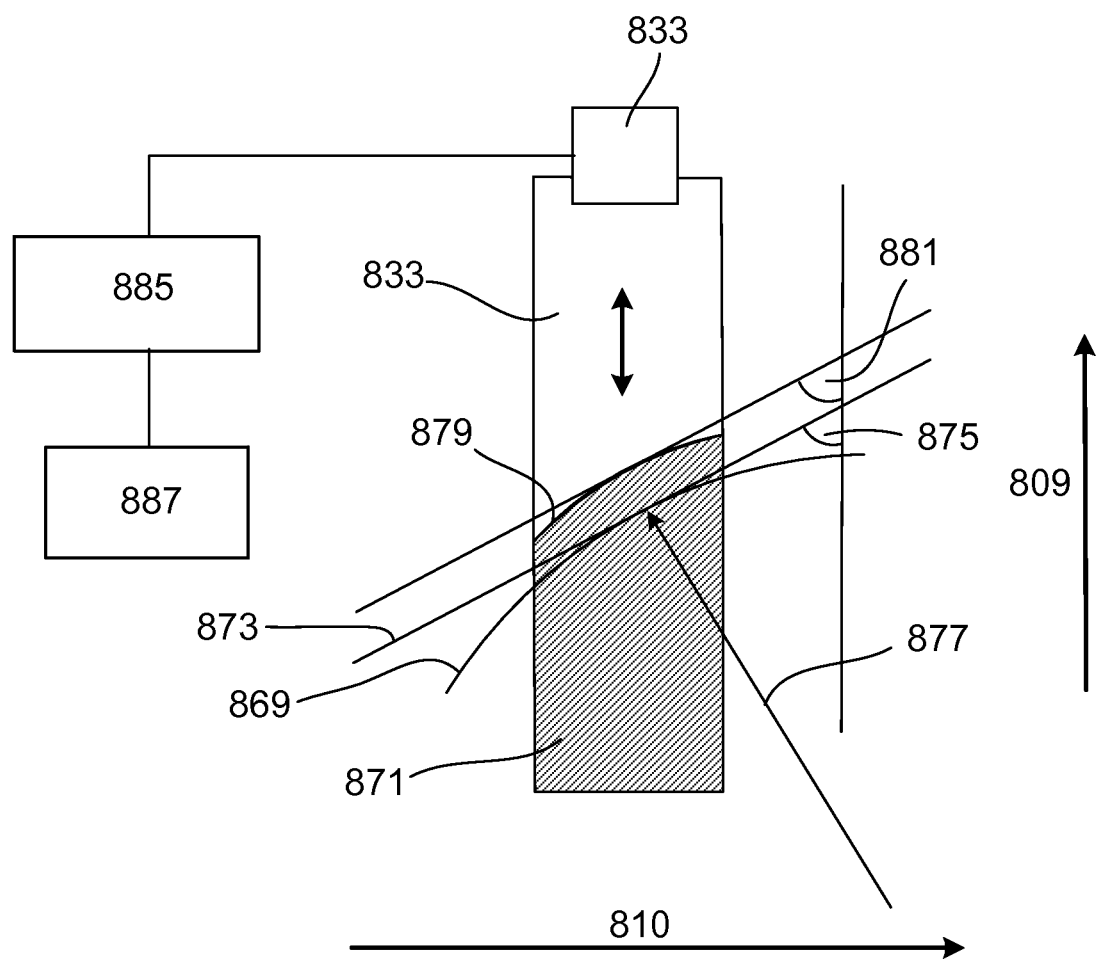
FIG. 8*a* shows a detailed illustration of a diaphragm configured according to the disclosure.

FIG. 8a shows an embodiment of the component according to the disclosure, a finger-like diaphragm 833 being illustrated in detail. By virtue of its extent perpendicular to the scan direction 810, the diaphragm 833 defines a diaphragm region 871. The radiation which passes through this region can be vignetted by the displacement of the diaphragm 833 in the scan direction, indicated by the double-headed arrow. The illumination of the diaphragm plane has a defining line 869 in the diaphragm region 871. The boundary curve, an isointensity line or an isodose line can be involved in this case. If the defining line in the diaphragm region 871 is approximated by a straight line 873, this results in the average angle 875 with respect to the scan direction 809. For more accurately describing the defining line it is furthermore possible to use the radius 877 of the best circle fit to the section of the defining line in the diaphragm region 871.

If a rectangular diaphragm having a front edge running perpendicular to the scan direction were used, then this would result in a variation along the direction 810, perpendicular to the scan direction, of the scan-integrated illumination power surface density in the object plane as soon as the diaphragm is set in such a way that it vignettes a portion of the radiation energy. This is evident from the fact that in such a case, that section of the rectangular diaphragm which delimits the illumination field would intersect the defining line at a large angle. This disadvantage can be avoided by the diaphragm according to the disclosure in that the form of the delimiting diaphragm edge 879 which encroaches on the diaphragm region 871 substantially corresponds to the form of the defining line 869 in the diaphragm region 871. If the position of such a diaphragm is changed in the scan direction, such that for example up to 10% or more of the illumination energy is vignetted in the diaphragm region, then the value of the scan-integrated illumination power surface density varies only little along the direction 810, perpendicular to the scan direction, if the delimiting diaphragm edge 879 coincides with an isodose line and substantially also has the same form.

Figure 8B:
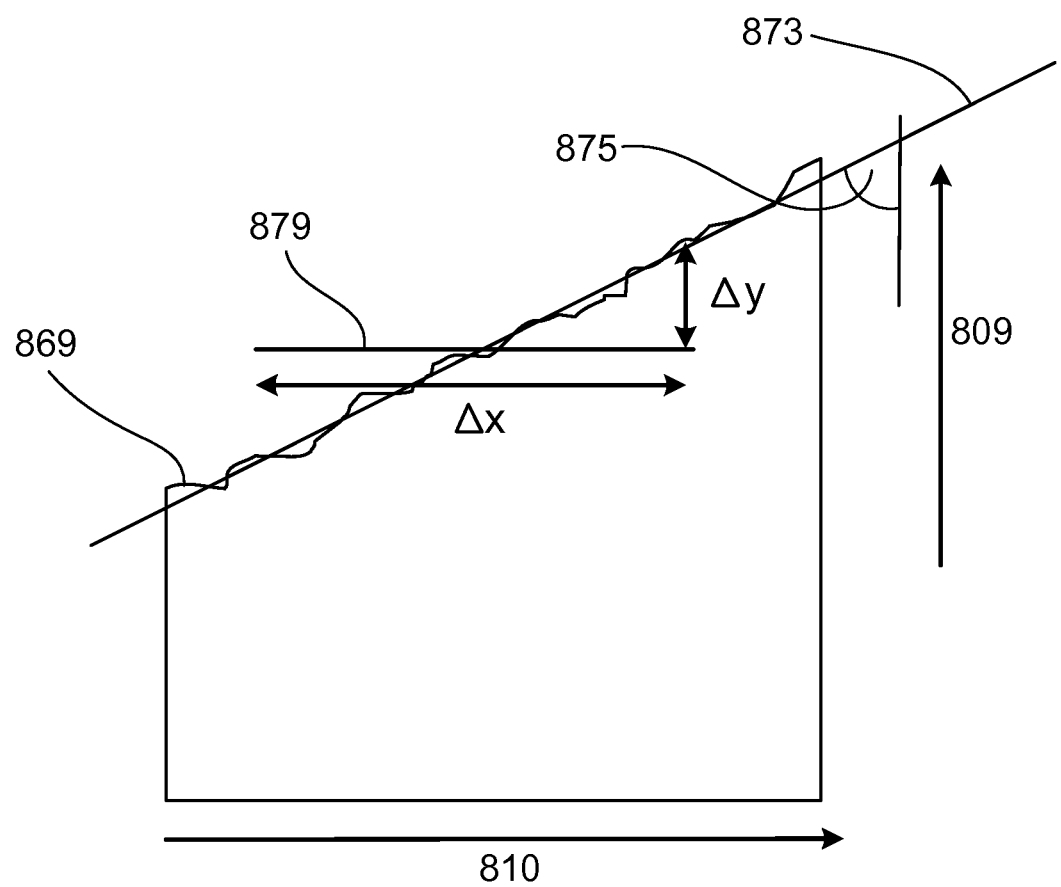
FIG. 8*b* shows a detailed illustration of the adaptation of a delimiting edge to an isodose line.

FIG. 8b shows a delimiting diaphragm edge 879 together with a defining line in a detailed illustration. An isodose line 869 can be involved here for example. In this case the delimiting diaphragm edge 879 runs perpendicular to the scan direction 809. On account of the deviation $\Delta y$ between the diaphragm edge and the isodose line, the result is a variation of the scan-integrated illumination energy in the assigned influencing region along the direction 810 perpendicular to the scan direction. In order that a very uniform feature size arises during the imaging of the structure-bearing mask into the image plane, it is advantageous if the scan-integrated illumination energy varies by less than 0.5%. The maximum permitted magnitude of the deviation $\Delta y$ can therefore be estimated from this. In this case, it is assumed as an approximation that a uniform illumination with a constant illumination power surface density $\rho(x, y) = \rho_0$ is present in the plane of the component according to the disclosure. Consequently, the scan-integrated illumination power surface density $D(x)$ is given by $D(x) = \rho_0 \cdot l(x)$, where $l(x)$ indicates the extent of the illumination in the scan direction at the position x with respect to the direction 810 perpendicular to the scan direction. In order that the integral $D(x)$ varies by less than 0.5% along this direction, then, $l(x)$ is also permitted to vary by not more than 0.5%. The result, therefore, is that at all positions in the diaphragm region, the deviation $\Delta y$ is permitted to be not more than 0.5% of the extent along the scan direction, that is to say that $$\max(\Delta y / l(x)) < 0.5\%$$

If the extent of the illumination in the scan direction is approximately 6 mm, for example, then the delimiting diaphragm edge is permitted to deviate by not more than 0.03 mm from the defining line. In the case of an extent of the diaphragm in the direction perpendicular to the scan direction of $\Delta X = 4$ mm, for example this results in a maximum angle 875 between the best fit straight line to the defining line and the delimiting diaphragm edge of $$\arctan(\Delta y / \Delta x / 2) \approx 0.86°.$$

It is advantageous, therefore, if the angle 881 between the best fit straight line to the delimiting diaphragm edge 879 and the scan direction deviates from the average angle 875 of the defining line by less than 1°. The angle 881 is not illustrated in FIG. 8b since the angle is 0° in this specific case.

Accordingly, it is advantageous if, in addition, the radius of the best circle fit (not illustrated in the drawing) to the delimiting diaphragm edge 867 deviates from the radius 877 of the best circle fit to the defining line 869 by less than 0.5%.

Furthermore, FIG. 8a indicates an adjusting device 883 in the form of an actuator which can be used to alter the position of the diaphragm in the scan direction 809. The actuator is driven by a regulating unit 885, which has been illustrated schematically. For controlling and/or regulating the diaphragm position, the regulating unit 885 uses for example a measurement signal from a sensor 887, which measures the scan-integrated illumination energy in the reticle plane, for example.

Figure 9:
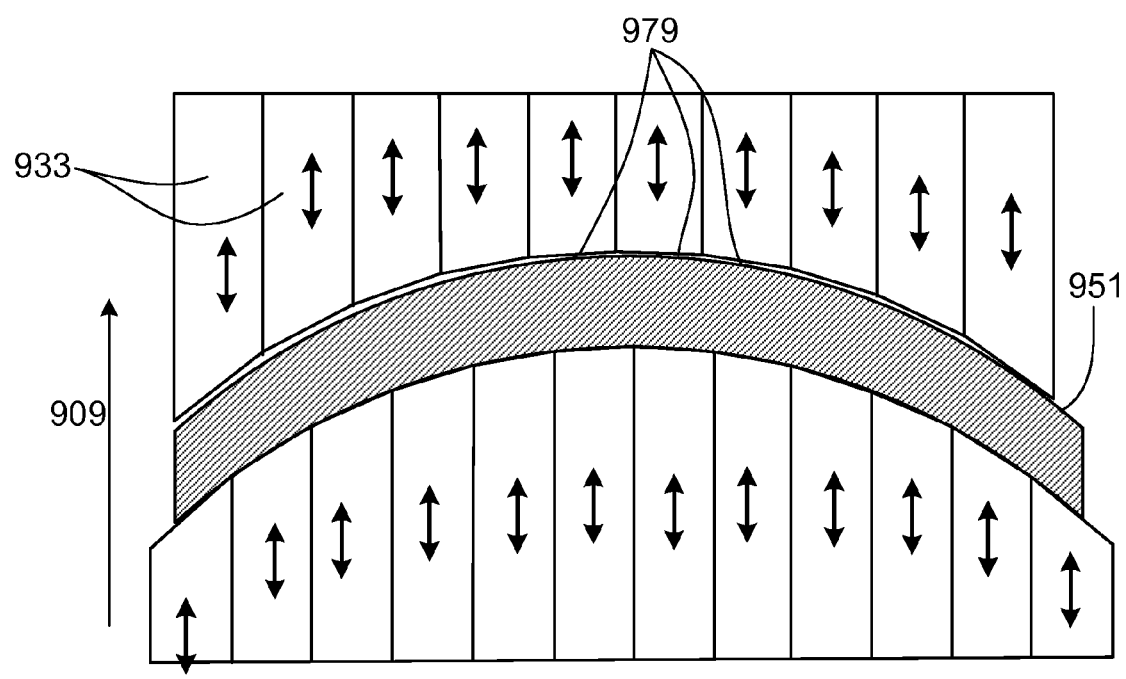
FIG. 9 shows a schematic illustration of the optical component according to the disclosure.

FIG. 9 schematically illustrates the component according to the disclosure. The form of the delimiting diaphragm edges 979 is adapted here to the boundary curve 951. In this figure, the position of all the diaphragms is such that no illumination radiation is vignetted. Each individual one of the diaphragm 933 can be adjusted variably in its position, however. This is indicated by double-headed arrows in FIG. 9. If the diaphragm position of a diaphragm is altered in the scan direction 909, then a portion of the illumination radiation can be vignetted in the diaphragm region in a targeted manner. However, since each of the diaphragms has an adapted delimiting diaphragm edge 979, such vignetting can be carried out without varying the scan-integrated illumination power surface density in the assigned influencing region of a diaphragm by significantly more than 0.5%, as has been explained above with reference to FIGS. 4 and 5.

Figure 10:
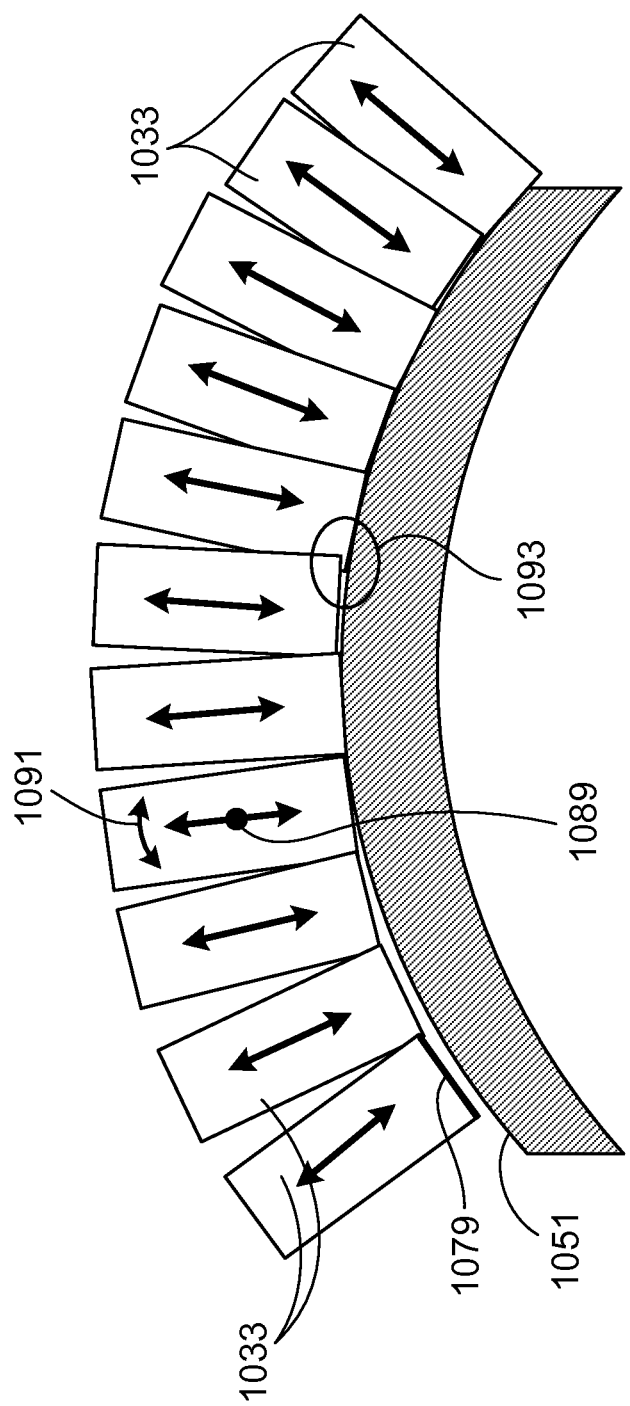
FIG. 10 shows a schematic illustration of the optical component according to the disclosure in a further embodiment.

FIG. 10 shows a further embodiment of the disclosure. In this configuration, the diaphragms 1033 are arranged in such a way that only one side of the illumination field can be delimited. Alternative or additionally, it is also possible to arrange diaphragms on the other side of the illumination field. Further, all the diaphragms have the same form. In the case illustrated in FIG. 10, the delimiting diaphragm edge 1079, which vignettes the illumination radiation given a corresponding diaphragm setting, is embodied perpendicular to the direction of movement of the diaphragm 1033, indicated by the double-headed arrows. Alternative, the delimiting edge 1079 can also be embodied as in any of the other embodiments. Despite the straight delimiting edges 1079, it is ensured by the arrangement of the diaphragms 1033 that the delimiting diaphragm edges 1079 are adapted to the boundary curve 1051. This has been achieved by arranging the diaphragms 1033 in a manner rotated with respect to one another. Consequently, the result here, too, is that the delimiting diaphragm edges 1079 of two diaphragms always differ in the case of an arbitrary displacement of the diaphragms. This is owing to the fact that the delimiting diaphragm edges 1079 of two diaphragms are at an angle with respect to one another. Alternatively or supplementarily the diaphragms 1033 can also be configured in such a way that they are mounted rotatably about a pivot 1089. The pivot is illustrated here within the diaphragm. It is also possible to rotate the diaphragm about an axis lying outside the diaphragm. The rotatable mounting makes it possible for example, to adapt the delimiting diaphragm edge 1079 to the form of the boundary curve 1051 by virtue of the fact that the diaphragm can be rotated, indicated by the curved double-headed arrow 1091. In order not to reduce the clarity of the figure, the rotatable mounting about the pivot 1089 is illustrated only for one of the diaphragms 1033. A corresponding mounting of a plurality or all of the diaphragms is likewise possible. Furthermore, FIG. 10 shows that the diaphragms partly overlap in the region 1093, for example, in order to avoid gaps.

Figure 11:
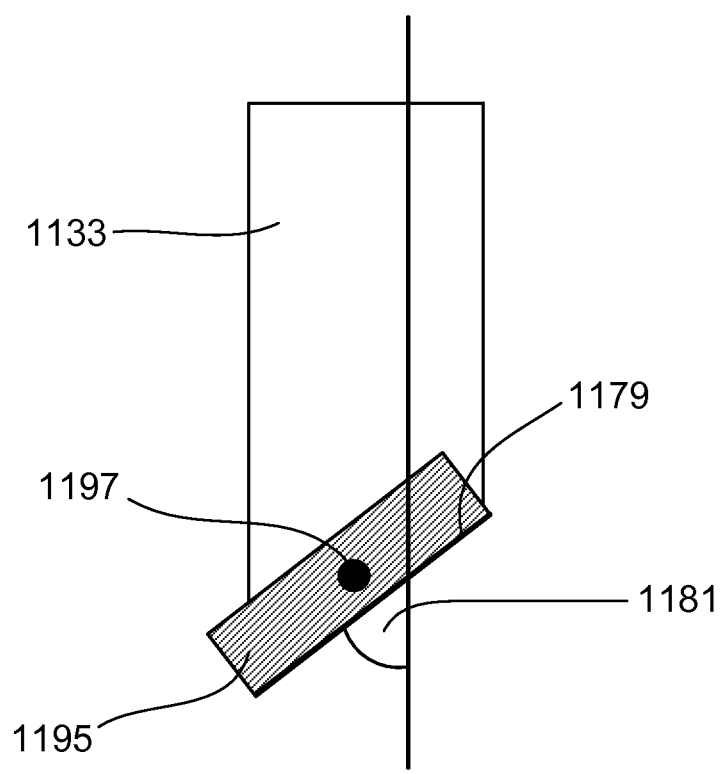
FIG. 11 shows a schematic illustration of a diaphragm configured according to the disclosure with a device for altering the delimiting edge.

FIG. 11 schematically illustrates a form—developed according to the disclosure—of an individual diaphragm with an exemplary embodiment of an adapting device for altering the delimiting edge. The diaphragm 1133 is equipped with a variable diaphragm region 1195 at its front end, which region is mounted rotatably about a pivot 1197. This configuration makes it possible to alter the angle 1181 of the delimiting diaphragm edge 1179 in order to be able to better adapt the diaphragm edge to the illumination in the diaphragm region. Such adaptation can be desirable, for example, if the illumination in the diaphragm region changes. This is the case, for example, if further diaphragms are introduced or altered in the illumination system in order for example to alter the angular distribution of the radiation in the object plane. Furthermore, such alteration can be caused by degradation of optical elements. Furthermore, it can be desirable to adapt the diaphragm edge if the position of the diaphragm is altered. In the case of a position change, it may be desirable to adapt the diaphragm edge to a different defining line possibly having a different form.

What is claimed is:

1. A component configured to set a scan-integrated illumination energy in an object plane, the component comprising:
   a plurality of diaphragms, each diaphragm having a delimiting edge configured to delimit an illumination field in the object plane,
   wherein:
      the plurality of diaphragms includes a first diaphragm and a second diaphragm;
      the first and second diaphragms are arranged alongside one another;
      the first diaphragm has a delimiting edge having a shape that delimits an illumination field in the object plane;
      the second diaphragm has a delimiting edge having a shape that delimits the illumination field in the object plane;
      the shape of the delimiting edge of the first diaphragm differs from the shape of the delimiting edge of the second diaphragm;
      the delimiting edge is configured so that the scan-integrated illumination energy varies by less than 0.5% in a region of the illumination field in the object plane; and
      the component is configured to be used in a microlithography projection exposure apparatus.

2. The component as claimed in claim 1, further comprising a device configured to alter positions of the diaphragms.

3. The component as claimed in claim 1, wherein adjacent diaphragms at least partly overlap.

4. The component as claimed in claim 1, wherein at least one of the diaphragms is exchangeable.

5. The component as claimed claim 1, wherein at least one of the diaphragms is configured so that its delimiting edge is adaptable.

6. The component as claimed in claim 1, wherein the shape of the delimiting edge of the first diaphragm is a curved shape.

7. The component as claimed in claim 1, wherein the diaphragms are rotatable relative to each other.

8. The component of claim 1, wherein:
   the delimiting edge of the first diaphragm has a first curved shape;
   the delimiting edge of the second diaphragm has a second curved shape; and
   the first curved shape is different from the second curved shape.

9. The component of claim 1, wherein the delimiting edge of the first individual diaphragm has a first radial curvature, and the delimiting edge of second individual diaphragm has a second radial curvature which is different from the first radial curvature.

10. An illumination system configured to illuminate an illumination field in an object plane, the illumination system comprising:
    a component configured to set a scan-integrated illumination energy in the object plane, the component comprising:
       a plurality of diaphragms, each diaphragm having a delimiting edge configured to delimit an illumination field in the object plane, wherein:
the plurality of diaphragms includes a first diaphragm and a second diaphragm;
the first and second diaphragms are arranged alongside one another;
the first diaphragm has a delimiting edge having a shape that delimits an illumination field in the object plane;
the second diaphragm has a delimiting edge having a shape that delimits the illumination field in the object plane;
the shape of the delimiting edge of the first diaphragm differs from the shape of the delimiting edge of the second diaphragm;
the delimiting edge is configured so that a scan-integrated illumination energy varies by less than 0.5% in a region of the illumination field in the object plane; and
the illumination system is configured to be used in a microlithography projection exposure apparatus.

11. The illumination system as claimed in claim 10, wherein the component is arranged in or near a plane, and the plane is selected from the group consisting of the object plane and a plane that is optically conjugate to the object plane.

12. The illumination system as claimed in claim 10, wherein the illumination field is arcuate.

13. The illumination system as claimed in claim 10, wherein the illumination field is rectangular.

14. The illumination system as claimed in claim 10, wherein all the diaphragms are arranged so that the illumination field can be delimited by the diaphragms on only one side.

15. The illumination system as claimed in claim 10, wherein all of the diaphragms are arranged so that the illumination field can be delimited by the diaphragms on two mutually opposite sides.

16. The illumination system as claimed in claim 10, wherein for each diaphragm there is a diaphragm region and the scan-integrated illumination energy is alterable in the assigned region of the illumination field via the diaphragm.

17. The illumination system as claimed in claim 16, wherein a delimiting edge has an average angle with respect to an isointensity line in the diaphragm region, and the average angle is less than 1°.

18. The illumination system as claimed in claim 16, wherein a delimiting edge has an average curvature whose radius of curvature differs from an average radius of curvature of an isointensity line in the diaphragm region by less than 0.5%.

19. The illumination system as claimed in claim 16, wherein the illumination has a boundary curve in the plane in which the component is arranged, and a delimiting edge has an average angle with respect to the boundary curve in the diaphragm region which is less than 1°.

20. The illumination system as claimed in claim 16, wherein a delimiting edge has an average curvature whose radius of curvature differs from an average radius of curvature of the boundary curve in the diaphragm region by less than 0.5%.

21. The illumination system as claimed in claim 16, wherein the illumination has an isodose line in the plane in which the component is arranged, and a delimiting edge has an average angle with respect to the isodose line in the diaphragm region which is less than 1°.

22. The illumination system as claimed in claim 16, wherein a delimiting edge has an average curvature whose radius of curvature differs from an average radius of curvature of the isodose line in the diaphragm region by less than 0.5%.

23. The illumination system as claimed in claim 10, wherein:
the illumination has an isointensity line in the plane in which the component is arranged;
there is a deviation $\Delta y$ in a scan direction between a delimiting edge and the isointensity line; and
the deviation $\Delta y$ is less than 0.5% of the extent of the illumination in the scan direction.

24. The illumination system as claimed in claim 10, wherein:
the illumination has a boundary curve in the plane in which the component is arranged;
there is a deviation $\Delta y$ in a scan direction between a delimiting edge and the boundary curve; and
the deviation $\Delta y$ is less than 0.5% of the extent of the illumination in the scan direction.

25. The illumination system as claimed in claim 10, wherein:
the illumination has an isodose line in the plane in which the component is arranged;
there is a deviation $\Delta y$ in a scan direction between a delimiting edge and the isodose line; and
the deviation $\Delta y$ is less than 0.5% of the extent of the illumination in the scan direction.

26. The illumination system as claimed in claim 10, further comprising a device configured to measure the scan-integrated illumination energy in the object plane.

27. An apparatus, comprising:
the illumination system of claim 10,
wherein the apparatus is a microlithography projection exposure apparatus.

28. The apparatus of claim 27, wherein the delimiting edge of the first diaphragm has a first radial curvature, and the delimiting edge of second diaphragm has a second radial curvature which is different from the first radial curvature.

29. A method, comprising:
using a microlithography projection exposure apparatus to produce microelectronic components,
wherein the microlithography projection exposure apparatus comprises the illumination system of claim 10.

30. The illumination system as claimed in claim 10, further comprising a unit configured to set a parameter of the component depending on a measurement signal, wherein the parameter is selected from the group consisting of a position of the diaphragms, an alteration of the delimiting edges, an exchange of the diaphragms and combinations thereof.

31. The illumination system of claim 10, wherein:
the delimiting edge of the first diaphragm has a first curved shape;
the delimiting edge of the second diaphragm has a second curved shape; and
the first curved shape is different from the second curved shape.

32. The illumination system of claim 10, wherein the delimiting edge of the first diaphragm has a first radial curvature, and the delimiting edge of second diaphragm has a second radial curvature which is different from the first radial curvature.

33. An illumination system configured to illuminate an illumination field having an arcuate form in an object plane, the illumination system comprising:
a component configured to set a scan-integrated illumination energy in the object plane, the component comprising:
a plurality of diaphragms, each diaphragm having a delimiting edge configured to delimit an illumination field in the object plane, the delimiting edge being in or near a plane, the plane being selected from the group consisting of the object plane and a plane that is optically conjugate to the object plane, wherein, for each diaphragm:

there is a diaphragm region and an assigned influencing region in the object plane so that the scan-integrated illumination energy can be altered in the assigned influencing region of the illumination field via the diaphragm; and the delimiting edge is configured so that the scan-integrated illumination energy varies by less than 0.5% in the assigned influencing region.

34. An apparatus, comprising:

the illumination system of claim 33, wherein the apparatus is a microlithography projection exposure apparatus.

35. A method, comprising:

using a microlithography projection exposure apparatus to produce microelectronic components, wherein the microlithography projection exposure apparatus comprises the illumination system of claim 33.

\* \* \* \* \*

UNITED STATES PATENT AND TRADEMARK OFFICE
CERTIFICATE OF CORRECTION

| | | |
|---|---|---|
| PATENT NO. | : 9,310,692 B2 | Page 1 of 1 |
| APPLICATION NO. | : 12/916882 | |
| DATED | : April 12, 2016 | |
| INVENTOR(S) | : Ralf Stuetzle et al. | |

It is certified that error appears in the above-identified patent and that said Letters Patent is hereby corrected as shown below:

Specification

Col. 2, line 43, delete "inhomongenaties" and insert -- inhomogeneities --.

Claims

Col. 12, line 40, Claim 5, after "claimed", insert -- in --.

Signed and Sealed this
Nineteenth Day of July, 2016

Michelle K. Lee
*Director of the United States Patent and Trademark Office*